United States Patent [19]

Ishikawa

[11] Patent Number: 4,842,978
[45] Date of Patent: Jun. 27, 1989

[54] PROCESS FOR PREPARATION OF LIGHT-SENSITIVE MICROCAPSULES CONTAINING SILVER HALIDE AND POLYMERIZABLE COMPOUND

[75] Inventor: Shunichi Ishikawa, Kanagawa, Japan

[73] Assignee: Fuji Photo Film Co., Ltd., Kanagawa, Japan

[21] Appl. No.: 119,449

[22] Filed: Nov. 12, 1987

[30] Foreign Application Priority Data

Nov. 11, 1986 [JP] Japan ................................ 61-269303

[51] Int. Cl.$^4$ .......................... B01J 13/02; G03C 1/72
[52] U.S. Cl. .................................... 430/138; 503/215;
428/402.21; 264/4.1; 264/4.7
[58] Field of Search .................. 430/138; 503/215;
428/402.21; 264/4.5, 4.7

[56] References Cited

U.S. PATENT DOCUMENTS

| | | | |
|---|---|---|---|
| 3,443,948 | 5/1969 | Bryan | 430/138 |
| 3,694,252 | 9/1972 | Gerba et al. | 430/138 |
| 3,694,253 | 9/1972 | Gerber et al. | 430/138 |
| 3,965,033 | 6/1976 | Matsukawa et al. | 503/215 |
| 4,138,362 | 2/1979 | Vassiliades et al. | 430/138 |
| 4,409,156 | 11/1903 | Hoshi et al. | 428/402.21 |
| 4,450,123 | 5/1984 | Egawa et al. | 428/402.21 |
| 4,525,520 | 6/1985 | Shioi et al. | 503/215 |
| 4,601,863 | 7/1986 | Shioi et al. | 503/215 |
| 4,629,676 | 12/1986 | Hayakawa et al. | 430/203 |
| 4,775,656 | 10/1988 | Harada et al. | 430/138 |

FOREIGN PATENT DOCUMENTS 137770  6/1986  Japan .............................. 428/402.21

Primary Examiner—Paul R. Michl
Assistant Examiner—Patrick A. Doody
Attorney, Agent, or Firm—Sughrue, Mion, Zinn, Macpeak & Seas

[57] ABSTRACT

A process for the preparation of light-sensitive microcapsules comprises encapsuling silver halide and a polymerizable compound with a shell comprising an aminoaldehyde resin in an aqueous medium in the presence of an anionic protective colloid, wherein the anionic protective colloid is a mixture of pectin and a polymer comprising a repeating unit derived from styrenesulfonic acid such as poly(styrenesulfonic acid) and a copolymer of an ethylenic unsaturated compound and styrenesulfonic acid.

9 Claims, No Drawings

PROCESS FOR PREPARATION OF LIGHT-SENSITIVE MICROCAPSULES CONTAINING SILVER HALIDE AND POLYMERIZABLE COMPOUND

BACKGROUND OF THE INVENTION

1. Field of the invention

The present invention relates to a process for the preparation of light-sensitive microcapsules.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974) -10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as a polymerization inhibitor within the area where a latent image of the silver halide has been formed, and the polymerizable compound within the other area is polymerized.

Further, Japanese Patent Provisional Publication Nos. 61(1986)-73145, 61(1986)-275742 and 61(1986)-278849 describe an improved embodiment of the light-sensitive material, which employs microcapsules in which the components of the light-sensitive layer such as silver halide and polymerizable compound are contained. An amino-aldehyde resin is preferably used as the shell of the microcapsules (Japanese Patent Application No. 61(1986)-53873). Therefore, light-sensitive microcapsules containing silver halide and a polymerizable compound which are encapsulated with a shell comprising an amino -aldehyde resin have been preferably employed in the light-sensitive material.

In a process for the preparation of the above-mentioned light-sensitive microcapsules, the silver halide and polymerizable compound are encapsuled with the shell in an aqueous mdeium preferably in the presence of an anionic protective colloid. The anionic protective colloid has a function of finely and uniformly dispersing the silver halide and polymerizable compound in the aqueous medium and keeping thus dispersed state. Examples of the anionic protective colloid are similar to those employed in preparation of a conventional microcapsule, such as a styrenesulfonic acid type polymer described in Japanese Patent Provisional Publication No. 56(1981)-51238 and methyl polygalacturonate (e.g. pectin) described in Japanese Patent Provisional Publication No. 60(1985)-87321.

SUMMARY OF THE INVENTION

An object of the present invention is to provide a process for the preparation of light-sensitive microcapsules which have a small average diameter and a narrow size distribution.

Another object of the invention is to provide a process for the preparation of light-sensitive microcapsules which are advantageously employable for inclusion in a light-sensitive material.

There is provided by the present invention a process for the preparation of light-sensitive microcapsules which comprises encapsulating silver halide and a polymerizable compound with a shell comprising an aminoaldehyde resin in an aqueous medium in the presence of an anionic protective colloid, wherein the anionic protective colloid is a mixture of pectin and a polymer comprising a repeating unit derived from styrenesulfonic acid.

According to study of the present inventor, light-sensitive microcapsules which have a small average diameter and a narrow size distribution where the mixture of pectin and a polymer comprising a repeating unit derived from styrenesulfonic acid (hereinafter referred to as styrenesulfonic acid type polymer) is used as an anionic protective colloid. This effect is due to the combined action of pectin and the polymer. The present inventor has found that a styrenesulfonic acid type polymer has an excellent function of finely and uniformly dispersing the silver halide and polymerizable compound in a medium and that pectin has an excellent function of keeping thus dispersed state. Therefore, the combination of pectin and the sulfonic acid type polymer is much superior in the function of a protective colloid to each of pectin and the polymer.

As a result, light-sensitive microcapsules having a small average diameter and a narrow size distribution can be prepared according to the present invention. In other words, a bulky microcapsule is scarcely formed. These microcapsules are advantageously employable for inclusion in a light-sensitive material. The light-sensitive material employing such microcapsules can give a clear image improved in the sharpness and the contrast, since the light-sensitive material scarecely contains a bulky microcapsule which causes stain in the image.

DETAILED DESCRIPTION OF THE INVENTION

In the present invention, the anionic protective colloid of microcapsules is a mixture of pectin and a styrenesolufonic acid type polymer. The mixture can be used in combination with other protective colloid, such as poly(vinylsulfonate ester salt), polyvinylsulfonate, maleic anhydride-styrene copolymer, maleic anhydrideisobutylene copolymer, maleic anhydride-ethylene copolymer, maleic anhydride-methyl vinyl ether copolymer, saponified product of polyvinyl alcohol, carboxymethylmodified polyvinyl alcohol, gum arabic, polyacrylate, a polyacrylate derivatives, an acrylate copolymer, carboxymethyl cellulose, gelatin, pullulan, phthalated gelatin, succinated gelatin, other gelatin derivatives, cellulose sulfate ester salt, and alginic acid.

The styrenesulfonic acid type polymer is homopolymer (i.e., polystyrenesulfonic acid) or a copolymer comprising a repeating unit derived from styrenesulfonic acid.

In the case that the styrenesulfonic acid type polymer is a copolymer, other repeating unit is preferably derived from an ethylenic unsaturated compound such as acrylic acid, maleic anhydride, ethylene and an ethylene derivative. The examples of the copolymer include acrylic acid-styrenesulfonic acid copolymer, maleic anhydride-styrenesulfonic acid copolymer, acrylic esterstyrenesulfonic acid copolymer, ethylene-styrenesulfonic acid copolymer, an ethylene deriative-styrenesulfonic acid copolymer, styrene-styrenesulfonic acid copolymer, vinyl acetate-styrenesulfonic acid copolymer, vinyl pyrrolidone-styrenesulfonic acid copolymer and vinyl sulfonic acid-styrenesulfonic acid copolymer. Among them, acrylic acid-styrenesulfonic acid copolymer, maleic anhydride-styrenesulfonic acid copolymer, ethylene-styrenesulfonic acid copolymer, an ethylene deriative-styrenesulfonic acid copolymer and styrene-styrenesulfonic acid copolymer are preferred.

The sulfo groups of the polymer may be in the form of either free acid or salt (including partial salt). Examples of the salts include sodium salt, potassium salt and ammonium salt. Among them, sodium salt and potassium salt are preferred.

The molecular weight of the polymer preferably ranges from 5,000 to 2,000,000, more preferably from 10,000 to 1,500,000, and most preferably from 100,000 to 1,000,000.

In the present invention, the weight ratio of the pectin to the polymer preferably ranges from 0.1 to 10, and more preferably from 0.2 to 5.

The process for the preparation of light-sensitive microcapsules according to the invention is described in more detail hereinbelow.

There is no specific limitation with respect to silver halide contained in the light-sensitive microcapsules. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent Application No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 $\mu$m, more preferably 0.001 to 2 $\mu$m.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,262, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noddle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When a sensitizing dye is added to the silver halide emulsion, the sensitizing dye is preferably added during the preparation of the emulsion. When an organic silver salt is inttroduced in the light-sensitive microcapsules, the emulsion of the organic silver salt can be prepared in the same manner as in the preparation of the silver halide emulsion.

In preparation of the light-sensitive microcapsules, the polymerizable compound is preferably used as a medium for preparation of a liquid composition containing silver salt and another component of the light-sensitive microcapsule.

There is no specific limitation with respect to the polymerizable compound, and any known polymerizable compounds including monomers, oligomers and polymers can be contained in the light-sensitive microcapsule. In the case that heat development (i.e., thermal development) is utilized for developing the light-sensitive microcapsule, the polymerizable compounds having a relatively high boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

Preferred polymerizable compounds employable for the light-sensitive microcapsule are compounds which are polymerizable through addition reaction or ring-opening reaction. Preferred examples of the compounds being polymerizable through addition reaction include compounds having an ethylenic unsaturated group. Preferred examples of the compounds being polymerizable through ringopening reaction include the compounds having an epoxy group. The compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include nbutyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate or hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive microcapsules employing these compounds which function as both the reducing agent and the polymerizable compound or as both the color image forming substance and the polymerizable compound are included in embodiments of the invention.

The amount of the polymerizable compound for incorporation into the light-sensitive microcapsule preferably ranges from 5 to $1.2 \times 10^5$ times (by weight) as much as the amount of silver halide, more preferably from 10 to $1 \times 10^4$ times as much as the silver halide.

A light-sensitive composition which is the polymerizable compound containing silver halide can be prepared using a silver halide emulsion. The light-sensitive composition can be also prepared using silver halide powders which can be prepared by lyophilization. The light-sensitive composition can be obtained by stirring the polymerizable compound and the silver halide using a homogenizer, a blender, a mixer or other conventional stirring device.

Polymers having a principal chain consisting essencially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound (i.e., light-sensitive composition) and the aqueous medium in preparation of the microcapsules. Therefore, using this polymer, silver halide can be introduced into the shell of the microcapsules. Such localized distribution of the silver halide does not adversely affect the property of the light-sensitive microcapsules, and it is probable that such distribution is preferable in enhancement of the sensitivity.

The light-sensitive composition can be also prepared dispersing microcapsules (which are much smaller than the light-sensitive microcapsules to be prepared) containing silver halide emulsion as the core in the polymerizable compound instead of employing the above polymer.

Some optional components of the light-sensitive microcapsules can be dissolved, emulsified or dispersed in the light-sensitive composition. Further, the necessary components for preparation of the microcapsules, such as shell material can be incorporated into the light-sensitive composition.

The optional components of the light-sensitive microcapsules include a reducing agent, a color image forming substance, a sensitizing dye, an organic silver salt, various kinds of image formation accelerators (e.g., base or base precursor, oil, surface active agent, compound functioning as an antifogging agent and/or a development accelerator, antioxidant, heat-melt solvent), a thermal polymerization inhibitor, a thermal polymerization initiator, a development stopping agent, a fluorescent brightening agent, a discoloration inhibitor, an antihalation dye or pigment, an antiirradiation dyes or pigment, a matting agent, an antismudging agent, a plasticizer, a water release, a binder, a photo polymerization initiator and a solvent of the polymerizable compound.

When a light-sensitive material is prepared using the light-sensitive microcapsules, the reducing agent and the other optional component can be contained in the microcapsules or arranged outside of the microcapsules in the light-sensitive layer. Generally, the reducing agent is preferably contained in the microcapsules, because the reaction can progress smoothly in such case. The reducing agent is more preferably dispersed or dissolved in the core (i.e., light-sensitive composition) of the microcapsules. In the case that a heat development is utilized in the use of the light-sensitive material, there is no problem in arranging the reducing agent outside of the microcapsules, because the reducing agent can permeate the microcapsules to reach the core.

The reducing agent contained in the light-sensitive microcapsules has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

These reducing agents are described in Japanese Patent Provisional Publication Nos. 61(1986)-183640, 61(1986)-188535 and 61(1986)-228441, T. James, "The Theory of the Photographic Process", 4th edition, 291-334 (1977), Research Disclosure No. 17029, 9-15 (June 1978), and Research Disclosure No. 17643, 22-32 (December 1978). The reducing agents described in the above text can be used in the light-sensitive material of the invention. Thus, "the reducing agent(s)" in the present specification means to include all of these known reducing agents.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p-or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or omethoxyphenyl)hydrazine, 1-(methoxycarbonylbenzohydryl)2-phenylhydrazine, 1-formyl-2-[4-{2 -(2,4-di-tert-pentylphenoxy)butylamide}phenyl]hydrazine, 1-acetyl- 2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethylN-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive microcapsule preferably ranges from 0.1 to 1,500 mole % based on the amount of silver (contained in the above-mentioned silver halide and an organic silver salt).

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigmentprecursor) which develops to give a color under application of external energy (e.g., heating, pressing, light irradiation, etc.) or by contact with other components (i.e., developer).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter - Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The above-mentioned light-sensitive composition (core material) containing silver halide, a polymerizabe compound and other optional compound is preferably emulsified in an aqueous medium to prepare the microcapsules according to the present invention.

In the present invention, the anionic protective colloid which is a mixture of pectin and a styrenesulfonic acid type polymer is dissolved in the aqueous medium prior to the addition of the light-sensitive composition.

The anionic protective colloid is preferably dissolved in an aqueous medium in such amount that the amount of pectin ranges from 1 to 8 weight % (more preferably from 2 to 6 weight %) based on the amount of the aqueous medium and/or that the amount of the polymer ranges from 2 to 10 weight % based on the amount of the aqueous medium.

The obtained emulsion of the light-sensitive composition is then processed for forming shell of the microcapsules. To the obtained emulsion is added a combination of urea and formaldehyde, or a melamine-formaldehyde precondensate. The emulsion was adjusted with respect to such conditions as pH and temperature to cause outer polymerization around the droplets of the core material to form the shell of the microcapsules.

There are known a variety of processes for the preparation of microcapsule by forming melamine-formaldehyde resin shells around small droplets of a hydrophobic liquid dispersed in an aqueous medium. Such known processes can be utilizable for the preparation of the microcapsules of the invention. Examples of the known processes are described in Japanese Patent Provisional Publications Nos. 55(1980)-15660, 55(1980)-47139 and 56(1981)-51238, and U.S. Pat. Nos. 4,100,103 and 4,233,178.

There are also known processes for the preparation of microcapsule by forming urea resin shells around small droplets of a hydrophobic liquid dispersed in an aqueous medium. Such known processes can be utilizable for the preparation of the microcapsules of the invention. Examples of the known processes are described in Japanese Patent Provisional Publication No. 55(1980)-119438 and U.S. Pat. No. 4,221,710.

The present inventor has found that in the process for the preparation of microcapsules, the encapsulation (polymerization) is smoothly proceed in a constant pH region depending on the shell material. For example, the reaction pH of melamine-formaldehyde preferably ranges from 5.0 to 7.0, that of urea-formaldehyde preferably is about 4.0.

In the light-sensitive microcapsules prepared above, the silver halide may be located within the core of the microcapsules and/or located on the interface between the core and the shell of the microcapsules.

The light-sensitive microcapsules prepared in the above-described manners can be separated from the aquoues medium by known separation methods such as evaporation, filtration and centrifugal separation.

The mean size of the light-sensitive microcapsules preferably ranges from 0.5 to 50 μm, and more preferably 1 to 25 μm. When the light-sensitive microcapsule is used in the light-sensitive material, the mean size of the light-sensitive microcapsule most preferably ranges from 1 to 15 μm.

The above-mentioned light-sensitive microcapsules can be advantageously employed for the formation of a light-sensitive layer of a light-sensitive material. Otherwise, the light-sensitive microcapsules of the invention can be employed as a light-sensitive adhesive.

The light-sensitive material using the above-mentioned light-sensitive microcapsules is further described below.

The light-sensitive material can be prepared, for instance, by the following process.

The light-sensitive material is usually prepared by dissolving, emulsifying or dispersing each of the components of the light-sensitive layer in an adequate medium to obtain coating solution wherein at least silver halide and a polymerizable compound are contained and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

A light-sensitive material can be prepared by coating and drying the above-prepared coating solution on a support in the conventional manner.

The present invention is further described by the following examples without limiting the invention.

surface active agent (trade name "Nissan Nonion NS 208.5" produced by Nippon Oils & Fats Co., Ltd.) and to the solution was then added a solution in which 0.36 g of the following reducing agent (I) and 1.22 g of the following reducing agent (II) was dissolved in 4 g of methylene chloride to obtain an oily phase (O).

To 2.0 g of the silver halide emulsion were added 0.45 g of 10 % aqueous solution of potassium bromide and 0.022 g of benzotriazole to obtain an aqueous phase (W).

Further, to the oily phase (O) was added the aqueous phase (W), and the mixture was stirred at 15,000 r.p.m. for 5 minutes to obtain W/O emulsion.

(Copolymer)

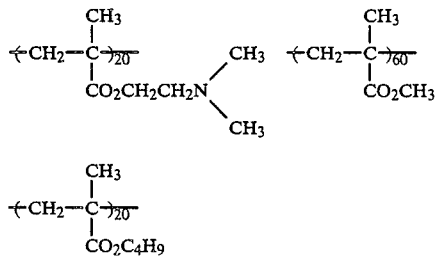

(Reducing agent (I))

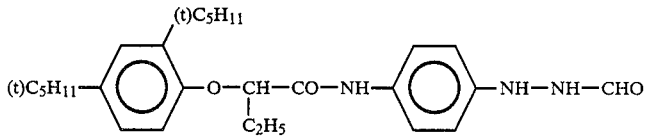

(Reducing agent (II))

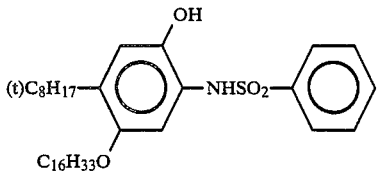

EXAMPLE 1

PREPARATION OF SILVER HALIDE EMULSION

In 1,200 ml of water were dissolved 25 g of gelatin and 3 g of potassium bromide, and the resulting gelatin solution was kept at 70° C. while stirring. To the gelatin solution, 600 ml of an aqueous solution containing 117 g of potassium bromide and 600 ml of an aqueous solution containing 0.74 mole of silver nitrate were added simultaneously at the same feed rate over a period of 45 min. After 5 minutes, to the resulting solution was added 200 ml of an aqueous solution containing 4.3 g of potassium iodide at the same feed rate over a period of 5 min. to obtain an emulsion.

The emulsion was washed for desalting, and then to the emulsion was added 24 g of gelatin, and stirred for 15 minutes at 50° C. to obtain a silver halide emulsion. The yield of the emulsion was 1,000 g.

Preparation of W/O emulsion

In 100 g of trimethylolpropane triacrylate were dissolved 0.04 g of the following copolymer and 10 g of Pargascript Red I-6-B (tradename of Ciba-Geigy). In 18 g of the resulting solution was dissolved 0.36 g of the

Preparation of light-sensitive microcapsule

To 30 g of 4.5 % aqueous solution of partial sodium salt of polyvinylbenzene sulfonic acid (trade name "VERSA TL 502" produced by National Starch, Co.; average molecular weight: 500,000) was added 30 g of 4.5 % aqueous solution of pectin. The solutions were mixed and then adjusted to pH 4.0 using 20 % aqueous solution of sodium hydroxide. The W/O emulsion was added to the obtained solution, and the mixture was stirred at 7,000 r.p.m. for 2 minutes using a homogenizer to obtain W/O/W emulsion.

To 72.5 g of the W/O/W emulsion were added 8.32 g of 40 % aqueous solution of urea, 3.19 g of 10 % aqueous solution of resorcinol, 8.56 g of 37 % aqueous solution of formaldehyde and 2.4 g of 10 % aqueous solution of ammonium sulfate in this order, and the mixture was heated at 60° C. for 2 hours while stirring. The mixture was adjusted to pH 7.0 using 20 % aqueous solution of dipotassium hydrogenphosphate. To the resulting mixture was added 3.73 g of 30 % aqueous solution of sodium hydrogen sulfite to obtain a dispersion containing lightsensitive microcapsules having a shell material made of urea-formaldehyde resin (average particle diameter: 7 μm).

Preparation of light-sensitive material

To 10.0 g of the microcapsule dispersion were added 1.0 g of 10 % aqueous solution of the surface active agent (tradename "Nissan Nonion NS 208.5" produced by Nippon Oils & Fats Co., Ltd.) and 1.8 g of 10 % aqueous solution (solvent: water/ethanol=50/50 as volume ratio) of guanidine trichloroacetate to obtain a coating solution. The coating solution was coated on a polyethylene terephthalate film having a thikness of 100 μm in coating amount of 35 cc/m$^2$ and dried to obtain a light-sensitive material (A).

EXAMPLE 2

Preparation of light-sensitive microcapsule

To 30 g of 4.5 % aqueous solution of partial sodium salt of polyvinylbenzene sulfonic acid (tradename "VERSA TL 502" produced by National Starch, Co.) was added 30 g of 4.5 % aqueous solution of pectin. The solutions were mixed and then adjusted to pH 6.0 using 20 % aqueous solution of sodium hydroxide. The W/O emulsion prepared in Example 1 was added to the solution, and the mixture was stirred at 7,000 r.p.m. for 2 minutes by means of homogenizer to obtain W/O/W emulsion.

Independently, the mixture of 13.2 g of melamine, 21.6 g of 37 % aqueous solution of formaldehyde and 70.8 g of water was stirred at 60° C. for 30 minutes to give a transparent melamine-formaldehyde precondensate.

To the above W/O/W emulsion was added 10 g of the precondensate. The mixture was then adjusted to pH 6.0 using 20 % aqueous solution of phosphoric acid while stirring. The mixture was heated to 65° C. and stirred for 90 minutes to obtain a microcapsule dispersion.

The microcapsule dispersion was adjusted to pH 3.8 using 20 % aqueous solution of phosphoric acid, and then to the dispersion was added 6.3 g of 40 % aqueous solution of urea to remove residual formaldehyde. The dispersion was stirred for 40 minutes at 65° C. to obtain a dispersion containing light-sensitive microcapsules having a shell material comprising melamine-formaldehyde resin (average particle diameter: 7 μm).

Preparation of light-sensitive material

To 10 g of the microcapsule dispersion were added 1.0 g of 10 % aqueous solution of the surface active agent (tradename "Nissan Nonion NS 208.5" produced by Nippon Oils & Fats, Co.) and 2 g of 10 % aqueous solution of sodium hydrogencarbonate to obtain a coating solution. The coating solution was coated on a polyethylene terephthalate film (thickness: 100 μm) in a coating amount of 35 cc/m$^2$ and dried at ordinaly temperature to obtain a light-sensitive material (B).

COMPARISON EXAMPLE 1

A light-sensitive microcapsule dispersion having a shell comprising melamine-formaldehyde resin was prepared in the same manner as in Example 2, except that 60 g of 4.5 % of aqueous solution of partial sodium salt of poly(vinylbenzenesulfonic acid) was used in place of 30 g of 4.5 % aqueous solution of partial sodium salt of poly(vinylbenzenesulfonic acid) and 30 g of 4.5 % aqueous solution of pectin.

The average particle diameter of the obtained microcapsules was 20 μm. It is observed that the light-sensitive microcapsule having a particle diameter of not less than 50 μm was contained in the dispersion.

A light-sensitive material (C) was prepared in the same manner as in Example 2, except that the above obtained light-sensitive microcapsule dispersion was used.

COMPARISON EXAMPLE 2

A light-sensitive microcapsule dispersion having shell comprising melamine-formaldehyde resin was prepared in the same manner as in Example 2, except that 60 g of 4.5 % of aqueous solution of pectin was used in place of 30 g of 4.5 % aqueous solution of partial sodium salt of poly(vinylbenzenesulfonic acid) and 30 g of 4.5 % aqueous solution of pectin.

The average particle diameter of the obtained microcapsules was 16 μm. It is observed that the light-sensitive microcapsule having a particle diameter of not less than 50 μm was contained in the dispersion.

A light-sensitive material (D) was prepared in the same manner as in Example 2, except that the above obtained light-sensitive microcapsule dispersion was used.

Preparation of image-receiving material

To 125 g of water was added 11 g of 40 % aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomile dispersing device. To 200 g of the resulting dispersion were added 6 g of 50 % latex of SBR and 55 g of 8 % aqueous solution of polyvinyl alcohol. The mixture was then uniformly coated on an art paper having basis weight of 43 g/m$^2$ to give a layer having wet thickness of 30 μm and dried to obtain an imagereceiving material.

Evaluation of light-sensitive material

Each of the light-sensitive materials (A), (B), (C) and (D) was imagewise exposed to light using a tungsten lamp at 2,000 lux for 1 second through an original having maximum transmission density of 0.1 and minimum transmission density of 4.0, and then heated on hot plate at 125° C. for 30 seconds. Each of the exposed and heated light-sensitive materials was then combined with the image-receiving material and passed through press rolls under pressure of 350 kg/cm$^2$ to obtain a magenta positive image on the image receiving material. The maximum density and maximum density of the obtained magenta positive image were measured using a reflection densitometer.

The results are set forth in Table 1.

TABLE 1

| | Light-Sensitive Material | Minimum Density | Maximum Density |
| --- | --- | --- | --- |
| Example 1 | (A) | 0.08 | 1.40 |
| Example 2 | (B) | 0.08 | 1.40 |
| Comp. Ex. 1 | (C) | 1.20 | 1.40 |
| Comp. Ex. 2 | (D) | 0.80 | 1.40 |

It is apparent from the results in Table 1, each of the light-sensitive materials (A) & (B) gives a clear positive image which has a low minimum density and a high contrast compared with each of the light-sensitive materials (C) & (D). It is thought that this is because the average particle diameter of microcapsules is small and the microcapsule having a large particle diameter is scarecely not contained in the materials (A) & (B).

I claim:

1. A process for the preparation of light-sensitive microcapsules which comprises encapsulating silver halide and an ethylenically unsaturated polymerizable compound with a shell comprising an amino-aldehyde resin in an aqueous medium in the presence of an anionic protective colloid, wherein the anionic protective colloid is a mixture of pectin and a polymer comprising a repeating unit derived from stylenesulfonic acid, and the weight ratio of the pectin to the polymer ranges from 0.1 to 10.

2. The process for the preparation as claimed in claim 1, wherein the polymer is a copolymer selected from the group consisting of acrylic acid-styrenesulfonic acid copolymer, maleic anhydride-styrenesulfonic acid copolymer, ethylene-styrenesulfonic acid copolymer, an ethylene deriative-styrenesulfonic acid copolymer and styrenestyrenesulfonic acid copolymer.

3. The process for the preparation as claimed in claim 1, wherein the polymer has a molecular weight in the range of 10,000 to 1,500,000.

4. The process for the preparation as claimed in claim 1, wherein the shell of the microcapsules comprises urea resin or melamine resin.

5. The process for the preparation as claimed in claim 1, wherein a reducing agent is further contained in the microcapsules.

6. The process for the preparation as claimed in claim 1, wherein a color image forming substance is further contained in the microcapsules.

7. The process for the preparation as claimed in claim 1, wherein the microcapsules have an average diameter in the range of 0.5 to 50 μm.

8. The process for the preparation as claimed in claim 1, wherein the anionic protective colloid is used in such amount that the amount of pectin ranges from 1 to 8 weight % based on the amount of the aqueous medium.

9. The process for the preparation as claimed in claim 1, wherein the anionic protective colloid is used in such amount that the amount of the polymer ranges from 2 to 10 weight % based on the amount of the aqueous medium.

* * * * *